United States Patent
Higuchi

(10) Patent No.: US 6,522,004 B1
(45) Date of Patent: *Feb. 18, 2003

(54) SEMICONDUCTOR INTEGRATED CIRCUIT DEVICE

(75) Inventor: Tsuyoshi Higuchi, Kanagawa (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/493,623

(22) Filed: Jan. 28, 2000

(30) Foreign Application Priority Data

Apr. 19, 1999 (JP) ............................................ 11-110879

(51) Int. Cl.$^7$ ............................................... H01L 23/48
(52) U.S. Cl. ................... 257/758; 257/202; 257/206; 257/208; 257/209; 257/210; 257/211; 257/259; 257/260; 257/390; 257/391; 257/758
(58) Field of Search ............................ 257/202, 206, 257/208, 209, 210, 211, 259, 260, 390, 391, 758

(56) References Cited

U.S. PATENT DOCUMENTS

| | | | |
|---|---|---|---|
| 5,378,925 A | * 1/1995 | Sasaki | 257/691 |
| 5,442,212 A | 8/1995 | Eimori | |
| 5,517,042 A | * 5/1996 | Kitamura | 257/207 |
| 5,517,060 A | 5/1996 | Kobayashi | |
| 5,710,462 A | 1/1998 | Mizushima | |
| 5,880,492 A | * 3/1999 | Duong et al. | 257/209 |
| 6,100,948 A | * 8/2000 | Kim et al. | 349/39 |
| 6,140,686 A | * 10/2000 | Mizuno et al. | 257/369 |

FOREIGN PATENT DOCUMENTS

| | | |
|---|---|---|
| EP | 0 817 197 | 1/1998 |
| JP | 7-45720 | 2/1995 |
| WO | 98 03994 | 1/1998 |

* cited by examiner

Primary Examiner—George Eckert
Assistant Examiner—Edgardo Ortiz
(74) Attorney, Agent, or Firm—Arent Fox Kintner Plotkin & Kahn, PLLC

(57) ABSTRACT

In a semiconductor storage device, a line of lower-side backing wiring is provided on a line of gate wiring via an insulation layer, and a line of upper-side backing wiring is provided further on the top layer thereof via another insulation layer. Contacts between the gate wiring and upper-side backing wiring are distributed and arranged on two or more different lines extending in a vertical direction with respect to a direction to which the gate wiring extends, and any contacts adjacent to each other of the contacts are arranged on different lines. The lower-side backing wiring passes through between the adjacent contacts.

14 Claims, 16 Drawing Sheets

SEMICONDUCTOR INTEGRATED CIRCUIT DEVICE

FIELD OF THE INVENTION

The present invention relates to a semiconductor integrated circuit device. More particularly this invention relates to a semiconductor integrated circuit device having a multi-layered wiring structure in which auxiliary signal lines are provided together with signal lines each made with polysilicon or polycide to prevent a delay in signal transmission.

BACKGROUND OF THE INVENTION

For example, a DRAM (dynamic random access memory) as one of semiconductor integrated circuit devices is configured to provide a MOS transistor and a capacitor in each of memory cells arranged in a matrix. A word line of the DRAM is formed by gate wiring of the MOS transistor, which is made of a material such as polysilicon or polycide having a comparatively large resistance. Therefore, by providing an auxiliary signal line called a backing wiring along the gate wiring, a signal can be propagated from one end of the word line to the other end thereof without development of long delays in its propagation.

FIG. 1 is a layout showing a conventional type of wiring pattern between memory cells of a DRAM having auxiliary signal lines for backing provided along lines of gate wiring. In general, each auxiliary signal line 11 is formed so as to extend along each gate wiring 12, as shown in FIG. 1, in a low-resistive wired layer provided on a layer upper than the gate wiring 12. The auxiliary signal line 11 is electrically connected to the gate wiring 12 via a contact 14 between a memory cell 13 and another memory cell 13. In this contact 14, a line width of the gate wiring 12 is wider than that of a wiring section other than the contact.

A wiring pitch of the auxiliary signal line 11 becomes wider by a widened line width of the gate wiring 12 in the contact 14. The wiring pitch of the auxiliary signal line 11 matches the pitch of the gate wiring 12, namely the pitch of the gate wiring 12 depends on the pitch of the auxiliary signal line 11. Thus, the pitch of the gate wiring 12 may become wider than the minimum pitch of the gate wiring 12 which can originally be produced due to restriction on the process. This causes a higher degree of integration of a DRAM to be prevented. It should be noted that, in FIG. 1, a dotted line within the memory cell 13 represents the fact that the gate wiring 12 and auxiliary signal line 11 are electrically connected to each other inside the memory cell 13.

To solve the above problem, there has been proposed a word line backing system that an auxiliary signal line for backing is divided into two different wired layers in upper and lower sides. Each wiring pitch of the upper and lower auxiliary signal lines is made two times wider than the pitch of the gate wiring by alternately arranging the upper and lower auxiliary signal lines for the gate wiring and making the pitch of the gate wiring narrower (e.g., Japanese Patent Laid-Open Publication No. HEI 7-45720).

According to this system, there is provided a wiring pattern that contacts each for electrically connecting the auxiliary signal line provided on the upper side to the gate wiring are arranged in a line in the vertical direction with respect to the direction to which the gate wiring extends and a lower-side linear auxiliary signal line passes through between the adjacent contacts.

Further, there has also been proposed a hierarchical word line system in which, in place of provision of the auxiliary signal line for backing, as shown in FIG. 2, a word line is divided into multiple sections to provide sub-word lines 15, and a sub-low decoder 16 is provided between the memory cells 13.

In the word line backing system disclosed in Japanese Patent Laid-Open Publication No. HEI 7-45720, however, the minimum pitch of the gate wiring actually depends on a space between a contact provided between an upper-side auxiliary signal line and gate wiring and a lower-side auxiliary signal line. Therefore, the pitch of the gate wiring can not be made narrow enough to achieve a higher degree of integration. Accordingly, there has been a problem that further higher degree of integration can not be achieved with the same semiconductor chip size or that a chip size can not be reduced with the same degree of integration.

Further, the above-described hierarchical word line system has a problem as follows. Because a plurality of sub-low decoders are distributed and arranged, the pitch of the word line can be made narrower. However, increase in the area due to provision of those sub-low decoders is larger than the case where a contact between gate wiring and the above-described auxiliary signal line for backing is provided. Resultantly, a higher degree of integration or reduction of a chip size can not be achieved.

SUMMARY OF THE INVENTION

The present invention has been made for solving the problems described above. It is an object of the present invention to provide a semiconductor integrated circuit device in which a higher degree of integration or reduction of a chip size can be achieved by providing upper and lower two-layered auxiliary signal lines in a specified wiring pattern.

In the present invention, auxiliary signal lines are provided in upper and lower layers on a signal line (gate wiring) via an insulation layer, contacts each between the signal line and the upper-side auxiliary signal line (upper-side backing wiring) are distributed and arranged on two or more different lines extending in a vertical direction with respect to a direction to which the signal line extends, any contacts in a pair adjacent to each other among the contacts between the signal line and the upper-side auxiliary signal line are arranged on different lines, and the lower-side auxiliary signal line (lower-side backing wiring) passes through between the adjacent contacts.

With the present invention, the contacts each between the signal line and the upper-side auxiliary signal line are distributed and arranged on two columns, and also adjacent contacts in a pair are arranged on the different columns, and further the lower-side auxiliary signal line passes through between the adjacent contacts so as to weave through from one to the other. Therefore, even when a line width of the signal line is widened in the contact, the pitch of the lower-side auxiliary signal line does not need to be widened. Accordingly, wiring pitch of the upper and lower auxiliary signal lines can be made narrower, which allows a higher degree of integration of a semiconductor integrated circuit device or reduction of a chip size to be achieved.

In addition, auxiliary signal lines are provided in upper and lower layers on a signal line via an insulation layer, contacts each between the signal line and the upper-side auxiliary signal line are distributed and arranged on two or more different lines extending in a vertical direction with respect to a direction to which the signal line extends, any adjacent contacts in a pair among the contacts each between the signal line and the upper-side auxiliary signal line may be arranged on the different lines between the lower-side auxiliary signal lines in a pair adjacent to each other.

According to one feature of the present invention, contacts each between the signal line and the upper-side auxiliary signal line are distributed and arranged on two columns, and any adjacent contacts in a pair are arranged on the different columns between adjacent lower-side auxiliary signal lines in a pair. Therefore even when a line width of the signal line is widened in the contact, the pitch of the lower-side auxiliary signal line does not need to be widened. Accordingly, wiring pitch of upper and lower auxiliary signal lines can be made narrower, which allows a higher degree of integration of a semiconductor integrated circuit device or reduction of a chip size to be achieved.

In addition, the contact consists of a conductive island formed on the same wired layer as that of a lower-side auxiliary signal line, a first auxiliary contact for electrically connecting a signal line to the island, and a second auxiliary contact for electrically connecting the island to an upper-side auxiliary signal line, so that the first auxiliary contact and second auxiliary contact may be arranged on the same line.

Further, the contact consists of a conductive island formed on the same wired layer as that of a lower-side auxiliary signal line, a first auxiliary contact for electrically connecting a signal line to the island, and a second auxiliary contact for electrically connecting the island to a second auxiliary signal line, in which the first auxiliary contact and the second auxiliary contact may be displaced from each other and arranged on two different stages, and the signal line and the upper-side auxiliary signal line may also directly and electrically be connected to each other.

Furthermore, the first contact and the second contact may be provided alternately for every one unit or every two units for a plurality of signal lines.

Other objects and features of this invention will become apparent from the following description with reference to the accompanying drawings.

DESCRIPTION OF THE PREFERRED EMBODIMENTS

Embodiments of the semiconductor integrated circuit device according to the present invention will be described in detail below with reference to the related drawings. In the Embodiments below, a case where the semiconductor integrated circuit device according to the present invention is applied in a DRAM is explained.

Figure 1:
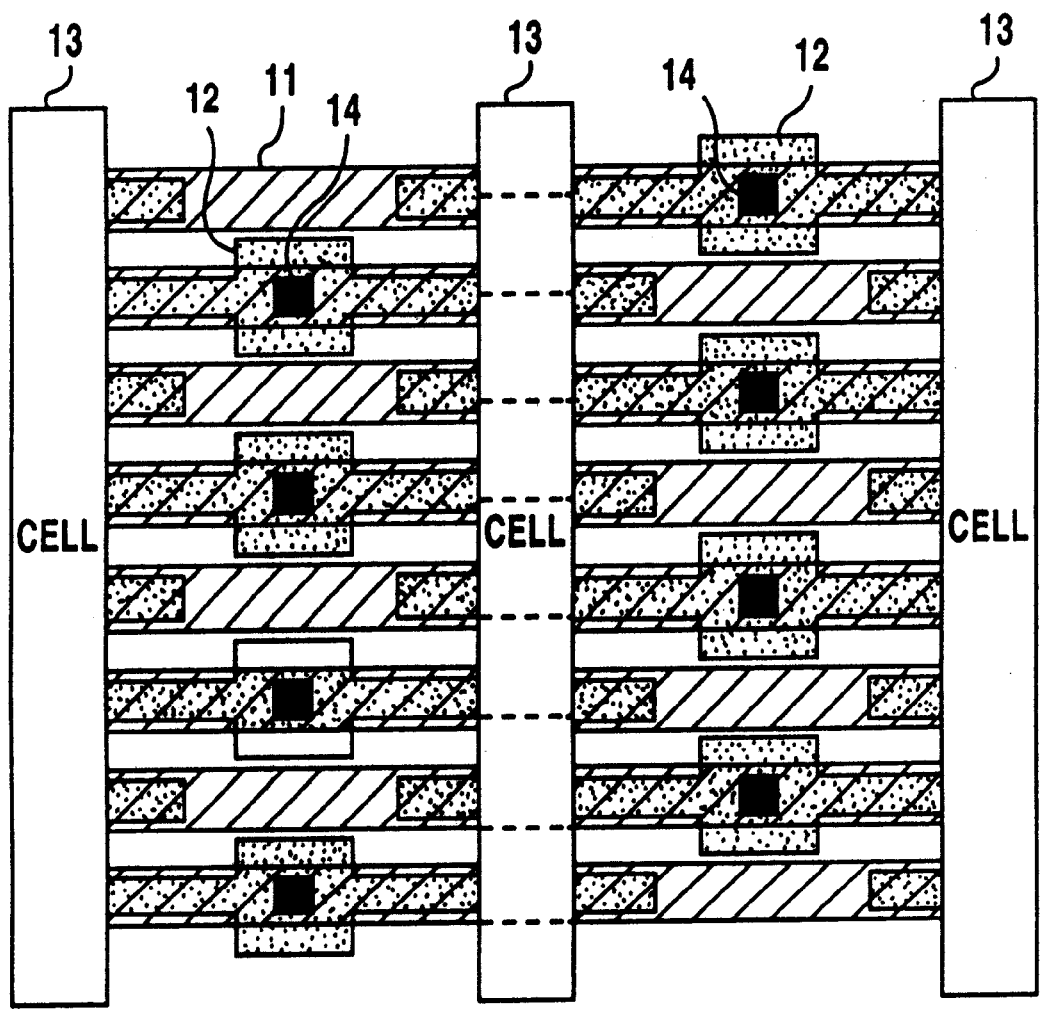
FIG. 1 is a layout showing a conventional type of wiring pattern between memory cells of the DRAM.
Figure 2:
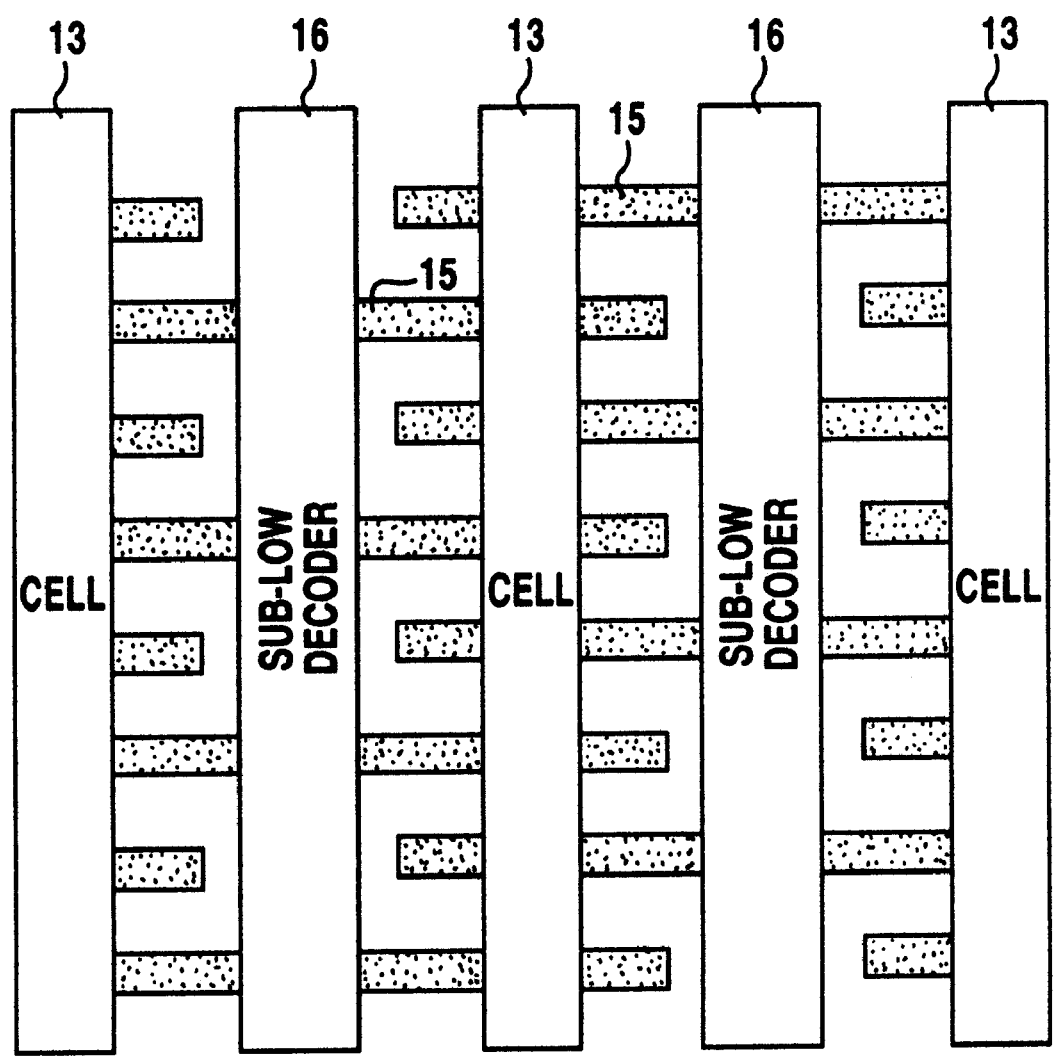
FIG. 2 is a layout showing configuration between memory cells of the DRAM based on a conventional type of hierarchical word line system.
Figure 3:
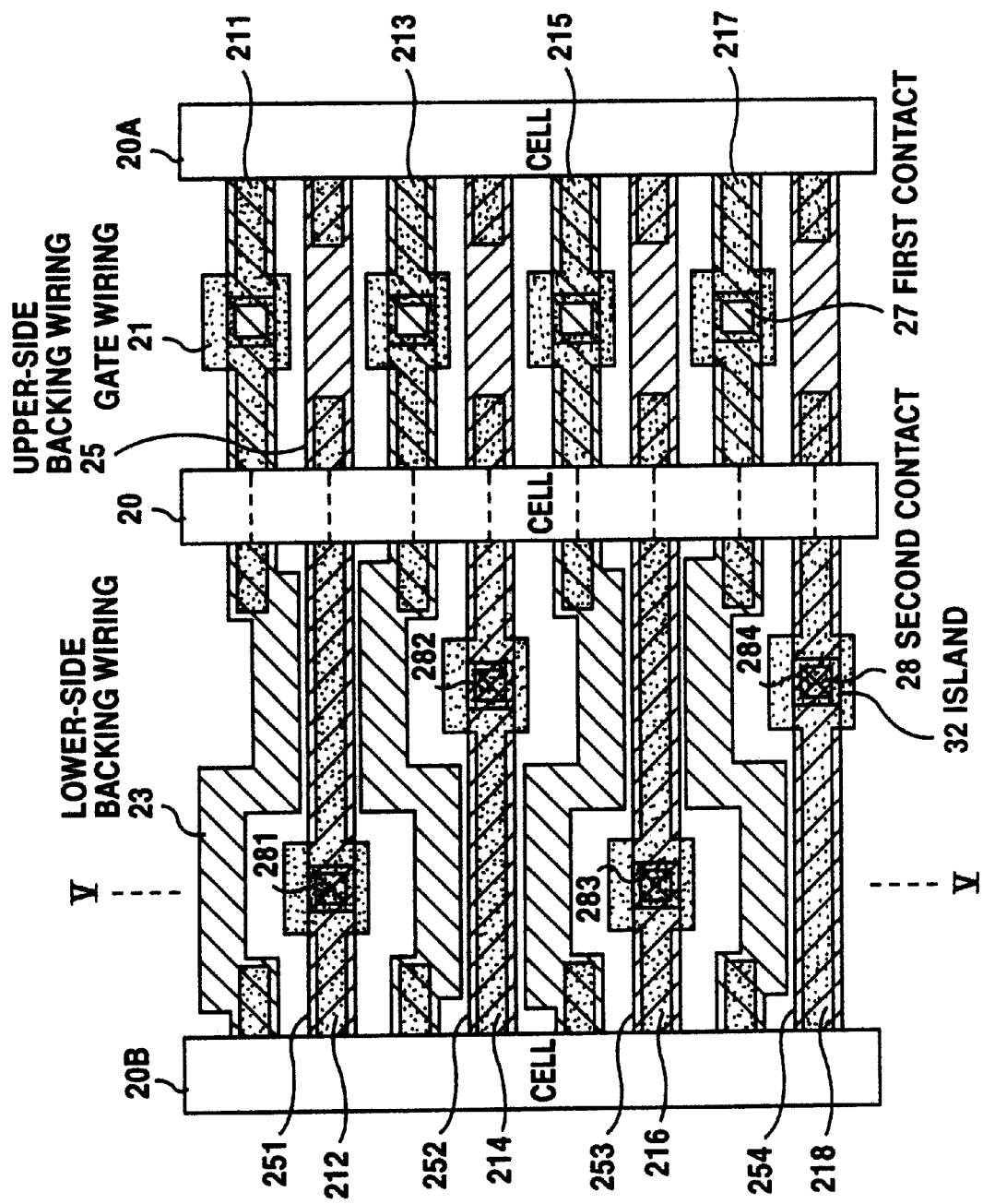
FIG. 3 is a layout showing a wiring pattern between memory cells of the DRAM in the first embodiment of the semiconductor integrated circuit device according to the present invention.
Figure 4:
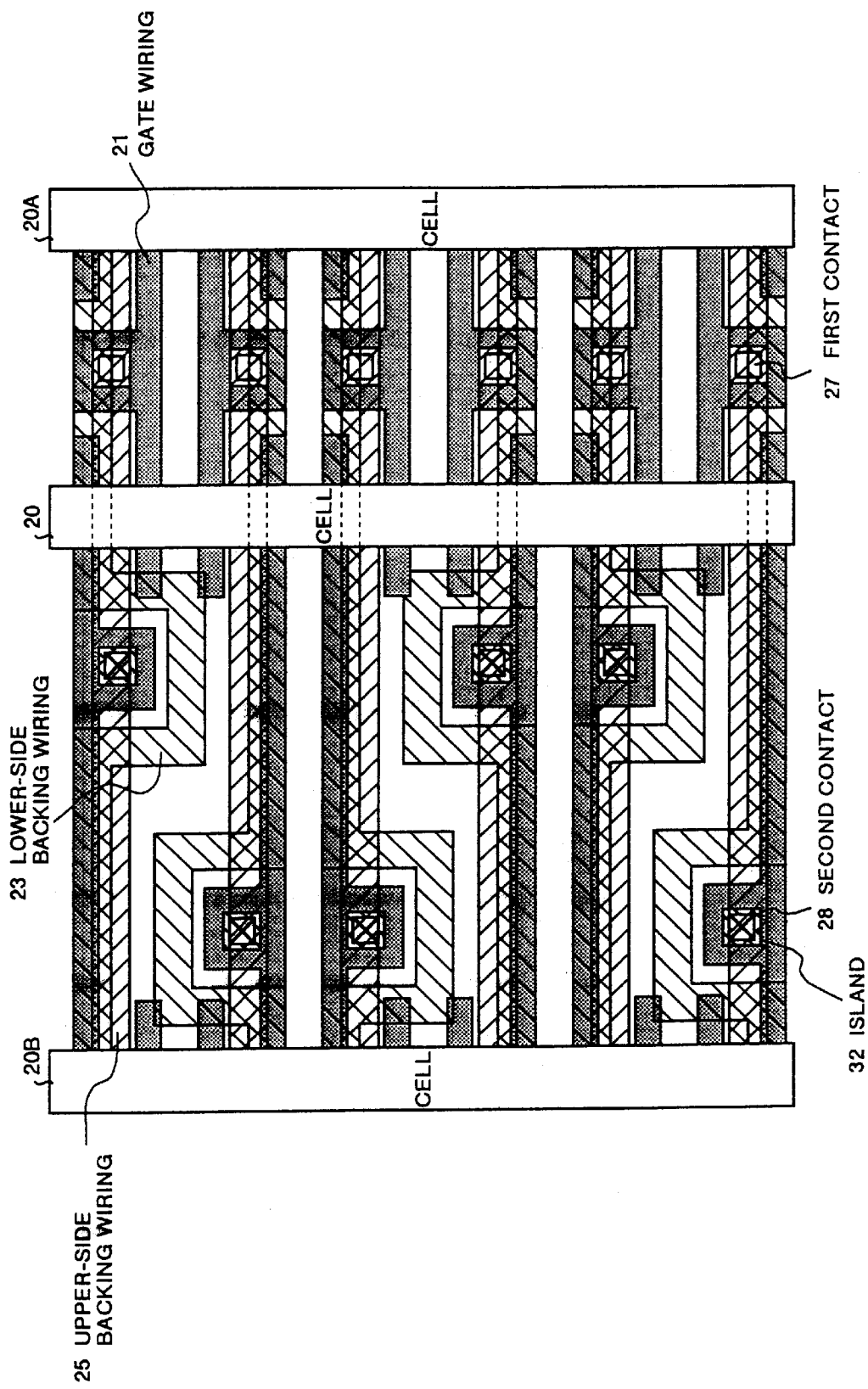
FIG. 4 is a layout showing a wiring pattern between memory cells of the DRAM in the first embodiment of the semiconductor integrated circuit device according to the present invention.
Figure 5:
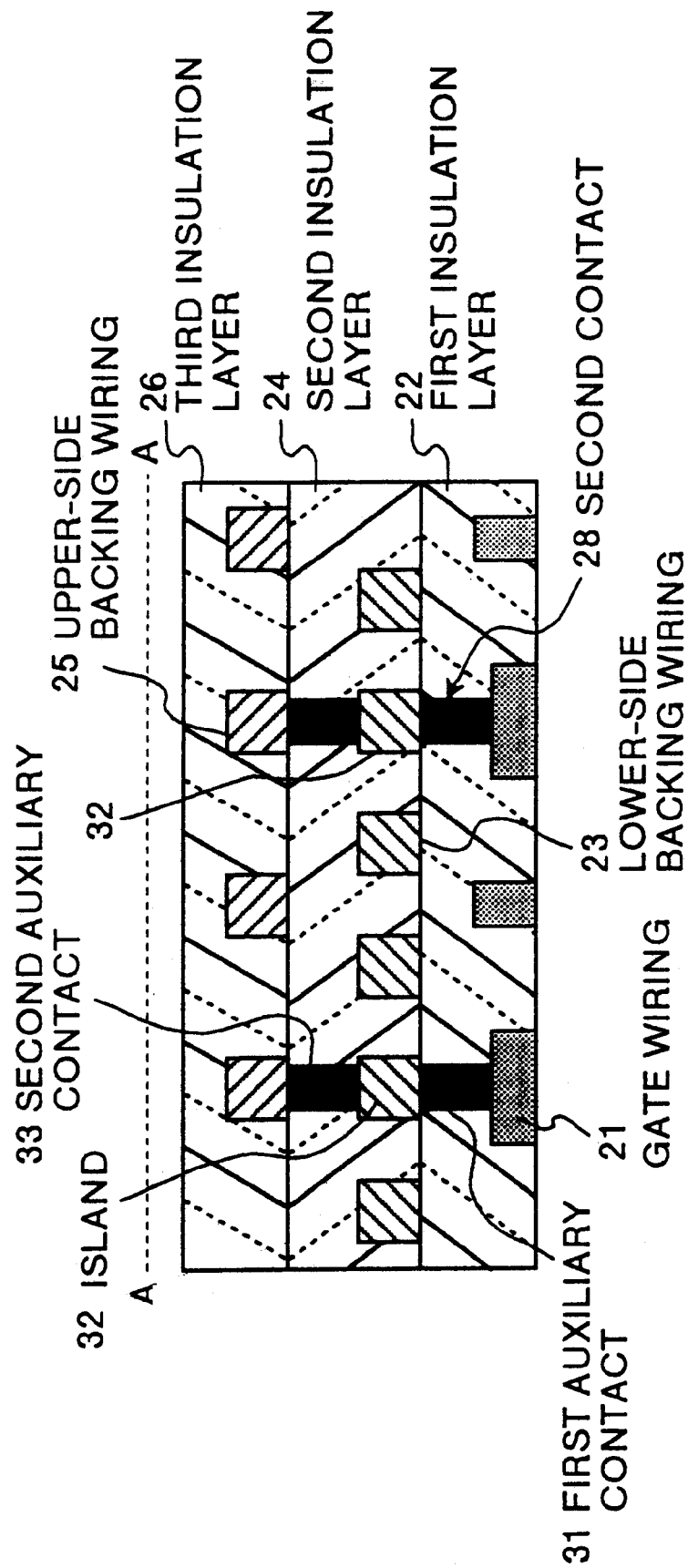
FIG. 5 is a cross-sectional view of the wiring pattern taken along the line A—A in FIG. 3.
Figure 6:
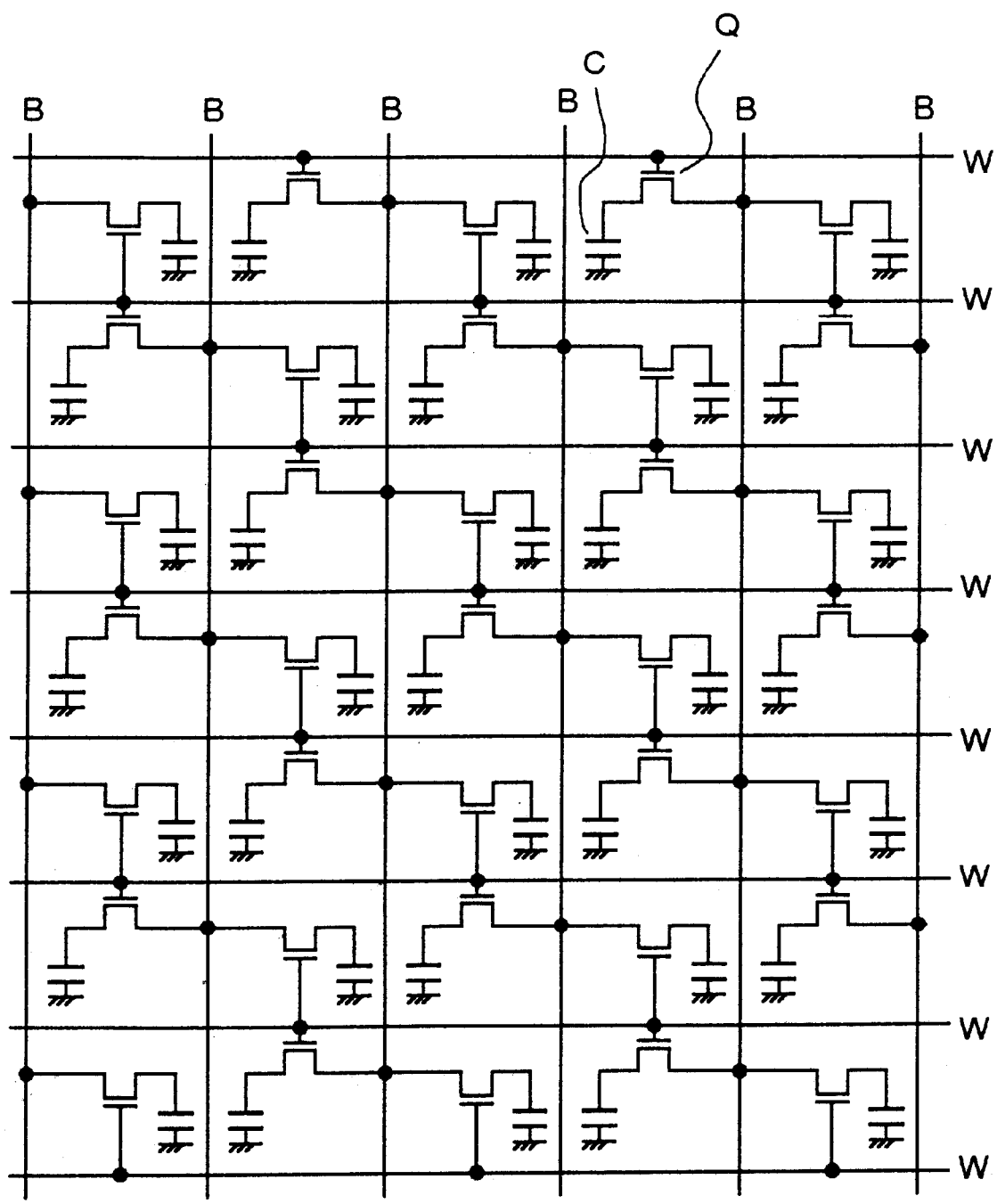
FIG. 6 is a circuit diagram of the DRAM with the present invention applied therein.

FIG. 3 and FIG. 4 are layouts showing a wiring pattern between memory cells of the DRAM in a first embodiment. FIG. 5 is a cross-sectional view of the wiring pattern along the line A—A in FIG. 3. FIG. 6 is a circuit diagram of the DRAM with the present invention applied therein. As shown in FIG. 6, the DRAM has a MOS transistor Q for switching and a capacitor C for accumulation of charge in each of memory cells and gate wiring of the transistor Q is a word line W.

As shown in FIG. 5, the DRAM in this first embodiment consists of a line of gate wiring 21 as a signal line. Further, there is provided a line of lower-side backing wiring 23 as a first auxiliary signal line formed on a wired layer provided on a layer upper than the gate wiring 21 via a first insulation layer 22, and a line of upper-side backing wiring 25 as a second auxiliary signal line formed on a wired layer provided on a layer upper than the lower-side backing wiring 23 via a second insulation layer 24. The second auxiliary signal line 25 is covered with a protective film or a third insulation layer 26 acting as an inter-layer insulation film between the immediate upper layer.

The first through third insulation layers 22, 24, and 26 are not shown in FIG. 3. Further, dotted lines inside a memory cell 20 represent the fact that the gate wiring 21 (211 to 218), the lower-side backing wiring 23, and the upper-side backing wiring 25 (251 to 254) are electrically connected to each other inside the memory cell 20 (the same applies for FIG. 4, FIG. 7, FIG. 9, and FIG. 11 to FIG. 16 explained below).

The lines of gate wiring 21 are provided in a staggered arrangement for every one line. Namely, as shown in FIG. 3, for instance, lines of odd-numbered gate wiring 211, 213, 215, and 217 from the top are provided between the memory cell 20 and the adjacent memory cell 20A on the right-hand side, whereas lines of even-numbered gate wiring 212, 214, 216, and 218 are provided between the memory cell 20 and the adjacent memory cell 20B on the left-hand side.

The lower-side backing wiring 23 is provided along each of the lines of odd-numbered gate wiring 211, 213, 215, and 217. The upper-side backing wiring 25 is provided along each of the lines of even-numbered gate wiring 212, 214, 216, and 218. The lines of low-side and upper-side backing wiring 23 and 25 are made of, for instance, aluminum or copper. However, there is no particular restriction on the material.

Each of the lines of odd-numbered gate wiring 211, 213, 215, and 217 and the corresponding lower-side backing wiring 23 are electrically connected to each other by a first contact 27. This first contact is a conductor penetrating the first insulation layer 22 between the memory cell 20 and the adjacent memory cell 20A.

Each of the lines of even-numbered gate wiring 212, 214, 216, and 218 and the corresponding upper-side backing wiring 25 are electrically connected to each other by second contacts 28 (281 to 284) between the memory cell 20 and the adjacent memory cell 20B provided on the opposite side of the memory cell 20A.

The second contacts 28 are alternately arranged on two different lines extending in the vertical direction with respect to the direction to which the gate wiring 21 extends (lateral direction in the figure). Namely, for example, the second contacts 281 and 283 for the lines of odd-numbered upper-side backing wiring 251 and 253 in FIG. 3 are arranged thereon closer to the memory cell 20B on the left-hand side, whereas the second contacts 282 and 284 for the lines of even-numbered upper-side backing wiring 252 and 254 are arranged thereon closer to the memory cell 20 at the center thereof.

As shown in FIG. 4, the second contacts 28 may alternately be arranged for every two units on the two different lines extending in the vertical direction with respect to the direction to which the gate wiring 21 extends (lateral direction in the figure). Namely, of second contacts 28 provided in both sides of the second contact 28, at least only either one of the contacts may be arranged on the different line described above.

The lines of lower-side backing wiring 23 are provided by bending so as to weave through between the second contacts 281, 282, 283, and 284 which are alternately arranged as described above. More specifically, the lower-side backing wiring 23 is formed in a substantially Z shape or in a substantially reverse Z shape provided along the second contacts 28 by being apart therefrom as far as possible between the memory cell 20 and the memory cell 20B.

In the first embodiment, the second contact 28 consists of a first auxiliary contact 31 made of a conductor penetrating the first insulation layer 22, a conductive island 32 provided on the same wired layer as the lower-side backing wiring 23, and a second auxiliary contact 33 made of a conductor penetrating the second insulation layer 24.

The gate wiring 21 and the island 32 are electrically connected to each other by the first auxiliary contact 31, whereas the island 32 and the upper-side backing wiring 25 are electrically connected to each other by the second auxiliary contact 33. In the first embodiment, the second auxiliary contact 33 is provided on the same line as that of the first auxiliary contact 31.

A manufacturing process of the DRAM in this first embodiment is explained below. At first, a MOS transistor Q and a capacitor C are formed on a semiconductor substrate to form a line of gate wiring 21 in a desired pattern. In the next step, the top surface thereof is laminated with the first insulation layer 22, and contact holes are made thereon.

The contact holes are filled with conductive material such as metal to form the first contact 27 and the first auxiliary contact 31. At the same time the lower-side backing wiring 23 and islands 32 are patterned and formed on the first insulation layer 22.

In the next step, the top surface thereof is laminated with the second insulation layer 24, contact holes are made thereon, and the holes are filled with conductive material such as metal to form the second auxiliary contacts 33. The upper-side backing wiring 25 is formed on the second insulation layer 24 and the top surface thereof is covered with a third insulation layer 26. Each of the processes can be executed through the known process.

According to the first embodiment, in an area where eight lines of gate wiring 211, 212, 213, 214, 215, 216, 217, and 218 are provided, four lines of upper-side backing wiring 25 are provided, whereas six lines in total of the lower-side backing wiring 23 including the islands 32 are provided, thus the upper-side backing wiring 25 can be provided with a pitch twice wider as compared to the pitch of the gate wiring 21 and the lower-side backing wiring 23 can be provided with a pitch around four by three (4/3) times wider. Therefore, the gate wiring 21 can be provided with a pitch smaller than the wiring pitch of the upper-side backing wiring 25 and lower-side backing wiring 23.

In this DRAM, the second contacts 28 are provided in a staggered arrangement so as not to be arranged in a line, and the lower-side backing wiring 23 is provided by bending so as to weave through between the second contacts by being apart therefrom as far as possible. Therefore, even if the line width of the gate wiring 21 is widened in the second contact 28, a pitch of the lower-side backing wiring 23 does not need to be widened and can be left as it is.

Therefore, each wiring pitch of the lines of upper and lower side backing wiring 23 and 25 can be made narrower, which allows the gate wiring 21 to be provided with a still smaller pitch, thus a higher degree of integration of a DRAM or reduction of a chip size can be achieved.

Figure 7:
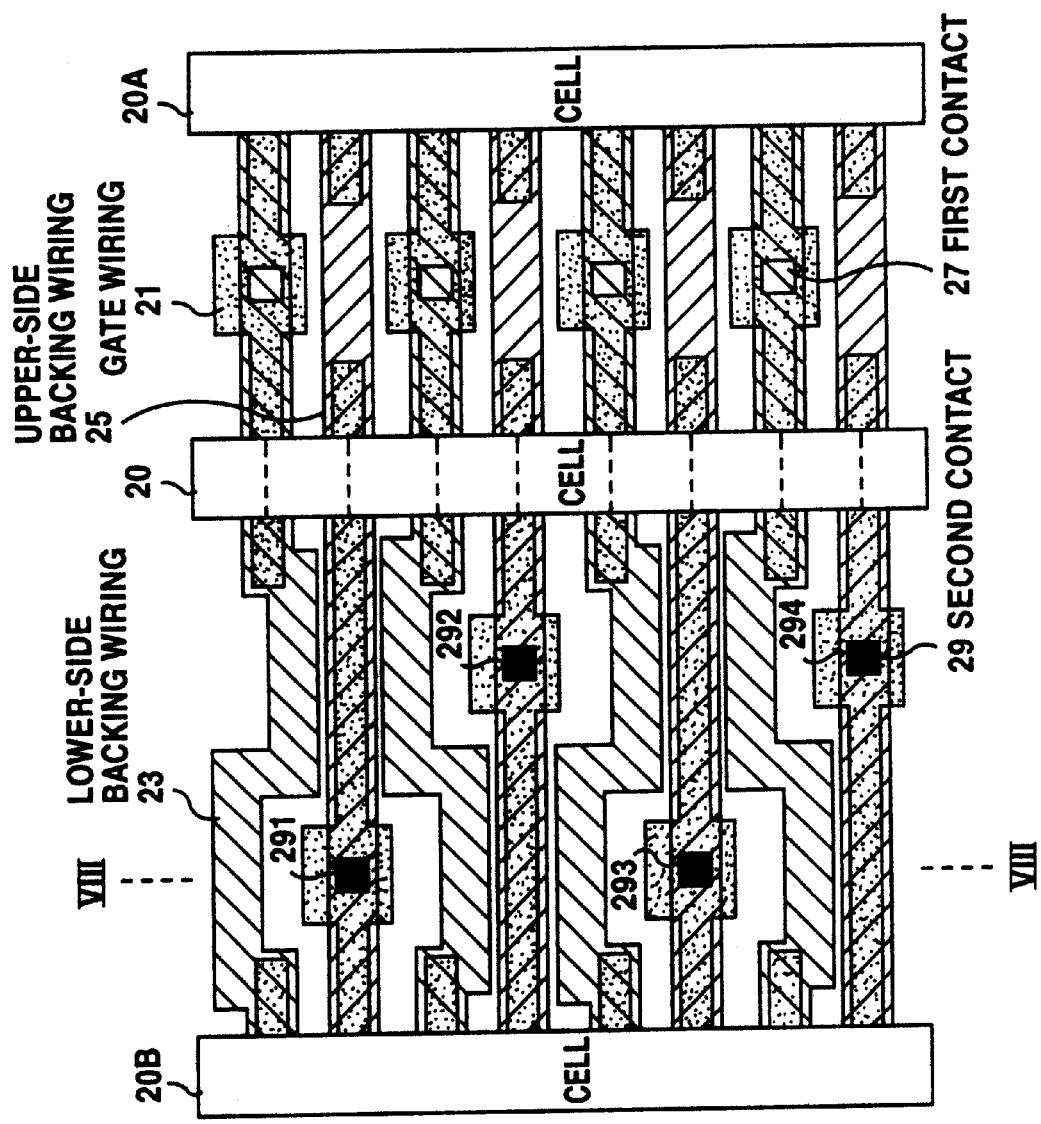
FIG. 7 is a layout showing a wiring pattern between memory cells of the DRAM in the second embodiment of the semiconductor integrated circuit device according to the present invention.
Figure 8:
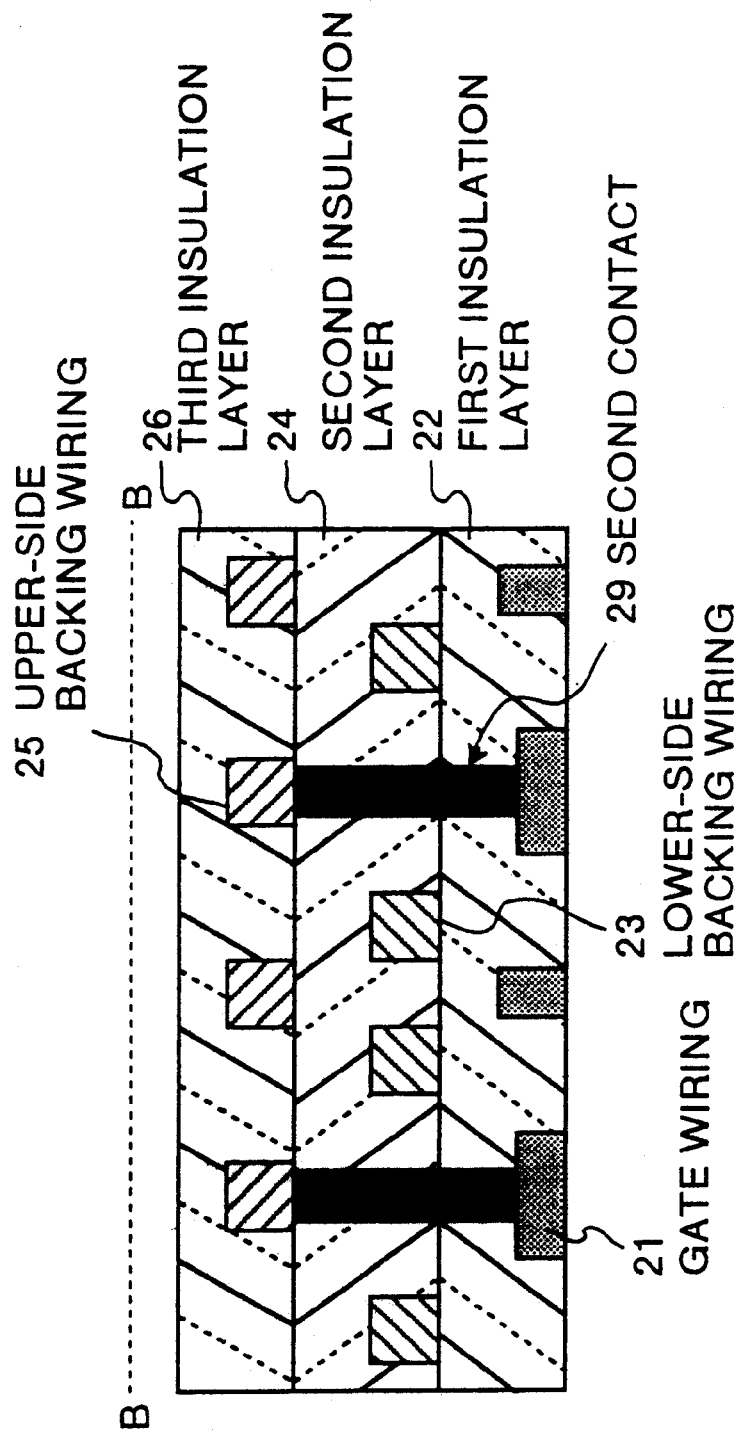
FIG. 8 is a cross-sectional view of the wiring pattern taken along the line B—B in FIG. 7.

FIG. 7 is a layout showing a wiring pattern between memory cells of a DRAM in the second embodiment. FIG. 8 is a cross-sectional view of the wiring pattern along the line B—B in FIG. 7. As shown in FIG.7 and FIG. 8, the second embodiment is realized by directly and electrically connecting the gate wiring 21 to the upper-side backing wiring 25 with the help of second contacts 29 instead of the second contacts 28 in the first embodiment. The other elements of the configuration are the same as those in the first embodiment, therefore the same reference numerals are assigned to the elements corresponding to those in the first embodiment and description thereof is omitted herein.

In the second embodiment, after the top surface is laminated with the first insulation layer 22, only contact holes for forming first contacts 27 is made therein. Contact holes for forming the second contacts 29 are made after the top surface of the contact is laminated with the second insulation layer 24.

According to the second embodiment, both of the lines of backing wiring 23 and 25 can be provided with a pitch around four by three (4/3) as compared to the pitch of the gate wiring 21, therefore the gate wiring 21 can be provided with a pitch smaller than each wiring pitch of the upper-side backing wiring 25 and lower-side backing wiring 23. Thus, a higher degree of integration in the DRAM or reduction of a chip size can be achieved in the same manner as in the first embodiment.

Figure 9:
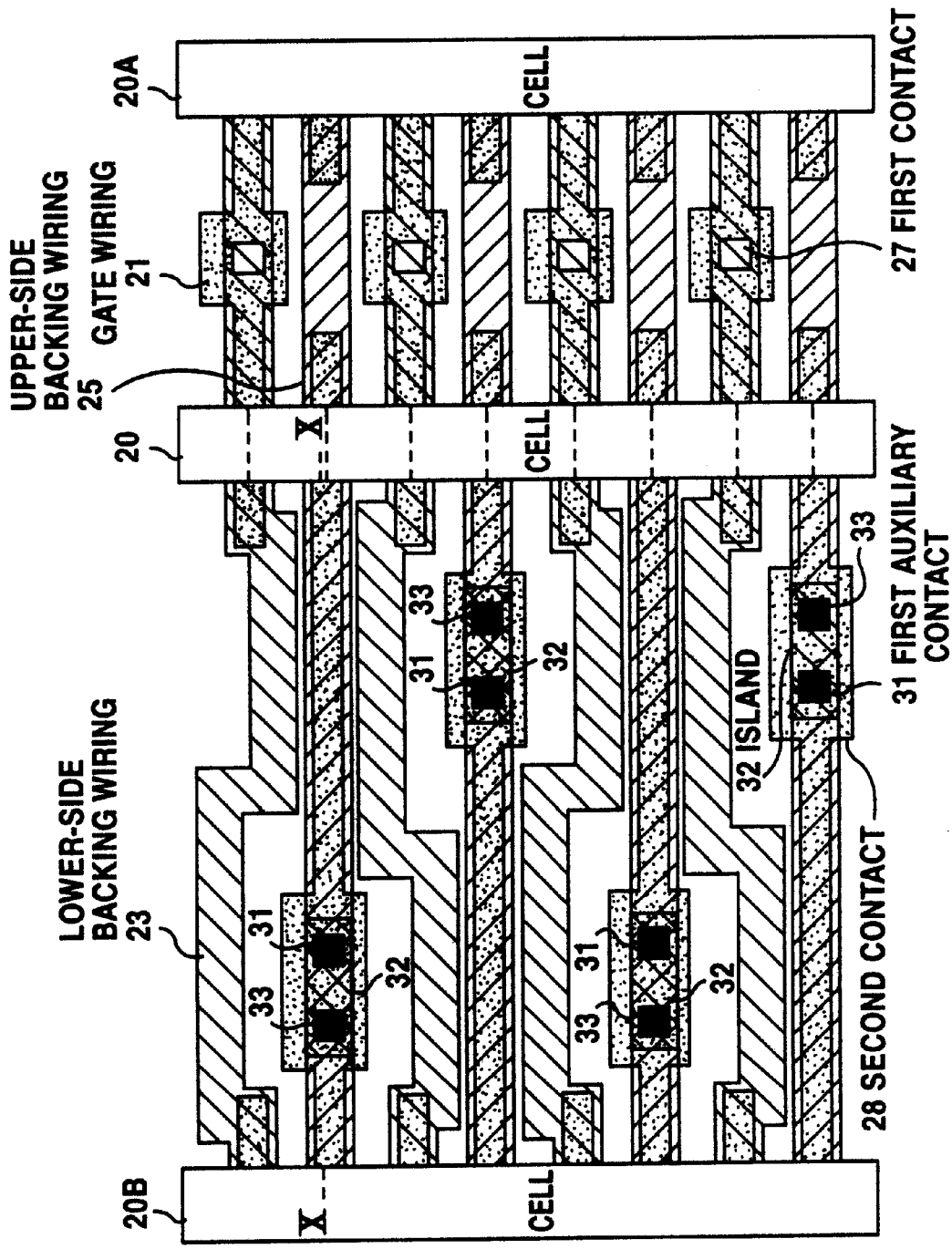
FIG. 9 is a layout showing a wiring pattern between memory cells of the DRAM in the third embodiment of the semiconductor integrated circuit device according to the present invention.
Figure 10:
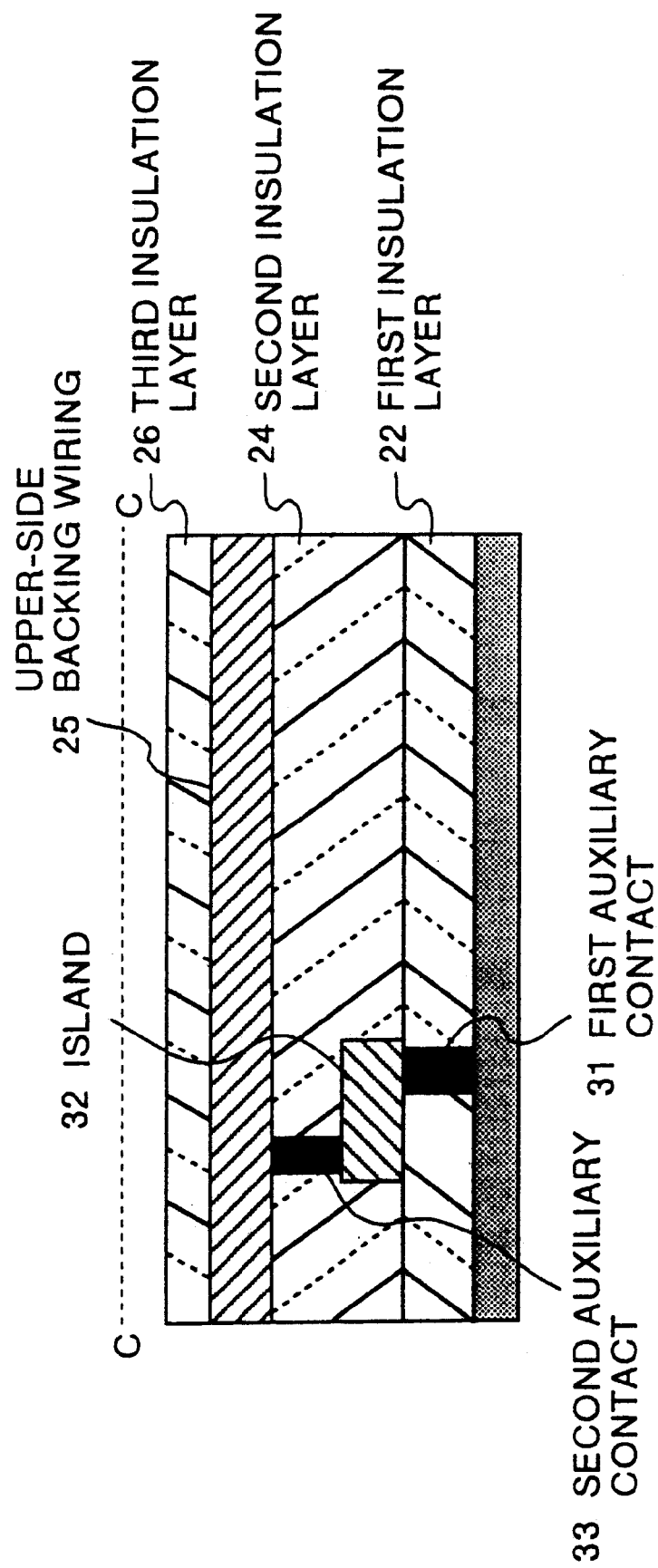
FIG. 10 is a cross-sectional view of the wiring pattern taken along the line C—C in FIG. 9.

FIG. 9 is a layout showing a wiring pattern between memory cells of a DRAM in a third embodiment. FIG. 10 is a cross-sectional view of the wiring pattern along a line C—C shown in FIG. 9. As shown in FIG. 9 and FIG. 10, the third embodiment is realized by arranging the first auxiliary contacts 31 and the second auxiliary contacts 33 based on displacement thereof from each other on the plane layout in the first embodiment.

Locations of the first auxiliary contacts 31 and the second auxiliary contacts 33 on the plane are interchanged between adjacent second contacts 28. Namely, in FIG. 9, a case where the first auxiliary contact 31 is located on the right-hand side from the second auxiliary contact 33 and a case where the first auxiliary contact 31 is located on the left-hand side therefrom repeat alternately. The other elements of the configuration are the same as those in the first embodiment, therefore the same reference numerals are assigned to the elements corresponding to those in the first embodiment and description thereof is omitted herein.

According to the third embodiment, in addition to the same effect as that of the first embodiment, as the first auxiliary contacts 31 and the second auxiliary contacts 33 are displaced from each other, a concave section which may be formed on the upper edge of the second auxiliary contacts 33 in formation of the contacts can be made smaller. Therefore, poor contact due to a bigger concave section can be prevented, thus it is possible to obtain such an effect that the second auxiliary contacts 33 and the upper-side backing wiring 25 can electrically be connected to each other more securely.

Figure 11:
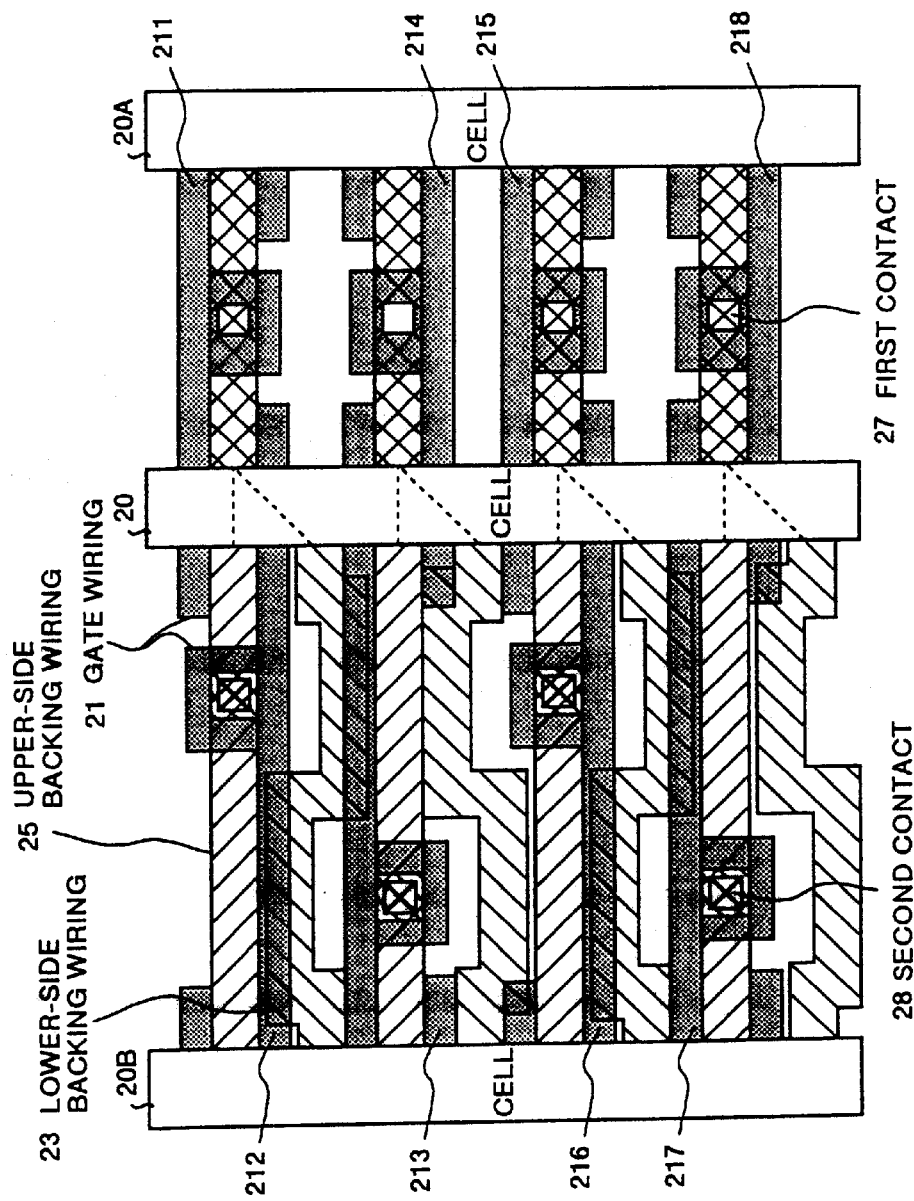
FIG. 11 is a layout showing a wiring pattern between memory cells of the DRAM in the forth embodiment of the semiconductor integrated circuit device according to the present invention.

FIG. 11 is a layout showing a wiring pattern between memory cells of a DRAM in a forth embodiment. As shown in FIG. 11, the forth embodiment is realized by providing the lines of gate wiring 21 in the first embodiment in a staggered arrangement for every two lines. The lower-side backing wiring 23 is electrically connected to each of lines of first, fourth, fifth, and eighth gate wiring 211, 214, 215, and 218 from the top in FIG. 11 via the first contacts 27.

The upper-side backing wiring 25 is electrically connected to each of lines of second, third, sixth, and seventh gate wiring 212, 213, 216, and 217 from the top in FIG. 11 via the second contacts 28. The other elements of the configuration are the same as those in the first embodiment, therefore the same reference numerals are assigned to the elements corresponding to those in the first embodiment and description thereof is omitted herein.

According to the forth embodiment, the upper-side backing wiring 25 can be provided with a pitch twice wider as compared to the pitch of the gate wiring 21 and the lower-side backing wiring 23 can be provided with a pitch around four by three (4/3) times wider. Therefore, the gate wiring 21 can be provided with a pitch smaller than each wiring pitch of the upper-side backing wiring 25 and lower-side backing wiring 23, thus a higher degree of integration in the DRAM or reduction of a chip size can be achieved in the same manner as in the first embodiment.

Figure 12:
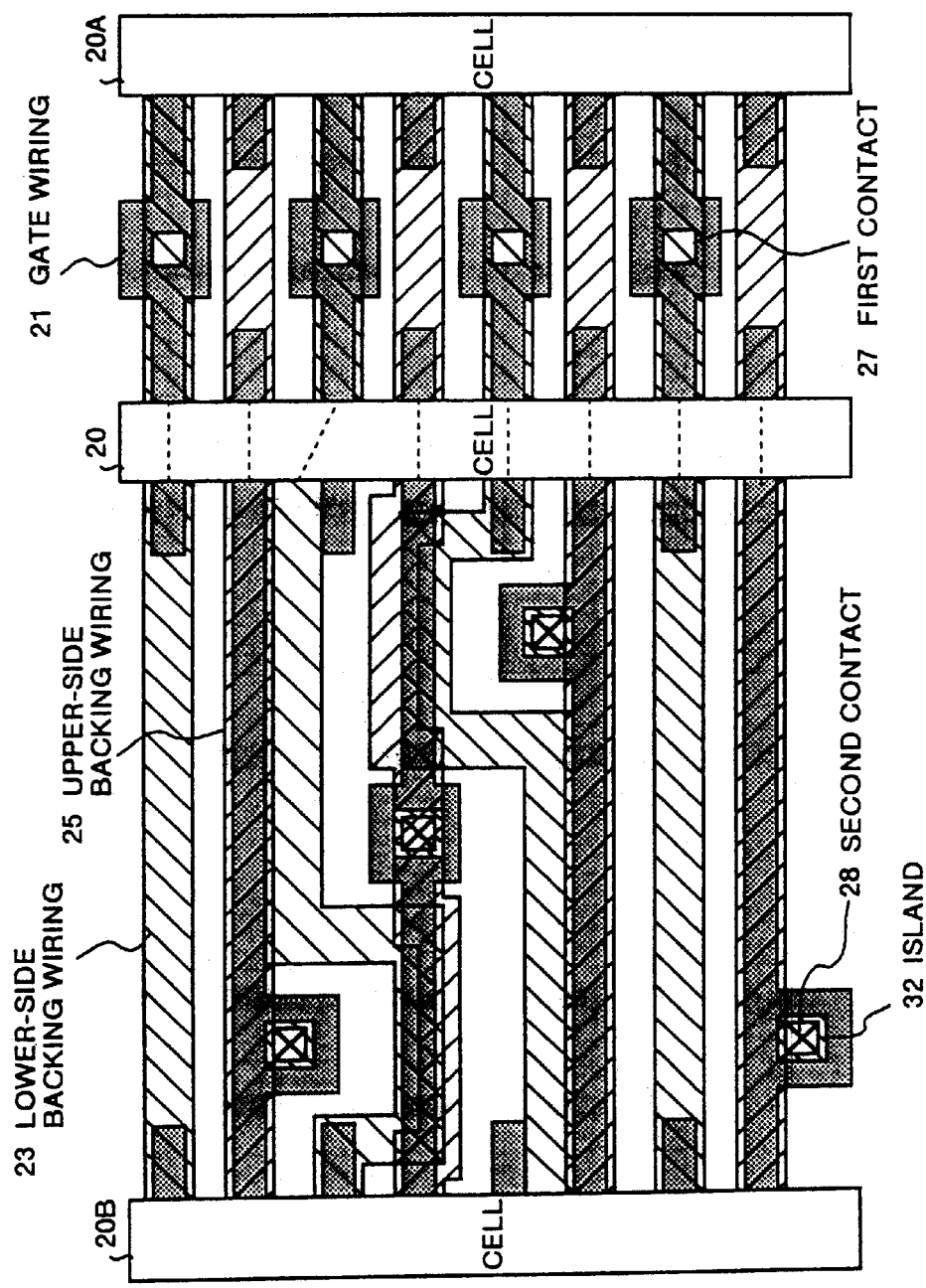
FIG. 12 is a layout showing a wiring pattern between memory cells of the DRAM in the fifth embodiment of the semiconductor integrated circuit device according to the present invention.

FIG. 12 is a layout showing a wiring pattern between memory cells of a DRAM in a fifth embodiment. As shown in FIG. 12, the fifth embodiment is realized by distributing second contacts 28, in the first embodiment, on three columns between the memory cell 20 and memory cell 20B and arranging the second contacts on the same column for every two units. The other elements of the configuration are the same as those in the first embodiment, therefore the same reference numerals are assigned to the elements corresponding to those in the first embodiment and description thereof is omitted herein.

According to the fifth embodiment, the upper-side backing wiring 25 and the lower-side backing wiring 23 can be provided with a pitch twice wider and with a pitch around three by two (3/2) times wider as compared to the pitch of the gate wiring 21. Therefore, the gate wiring 21 can be provided with a pitch smaller than each wiring pitch of the upper-side backing wiring 25 and lower-side backing wiring 23, thus a higher degree of integration in the DRAM or reduction of a chip size can be achieved in the same manner as in the first embodiment.

Figure 13:
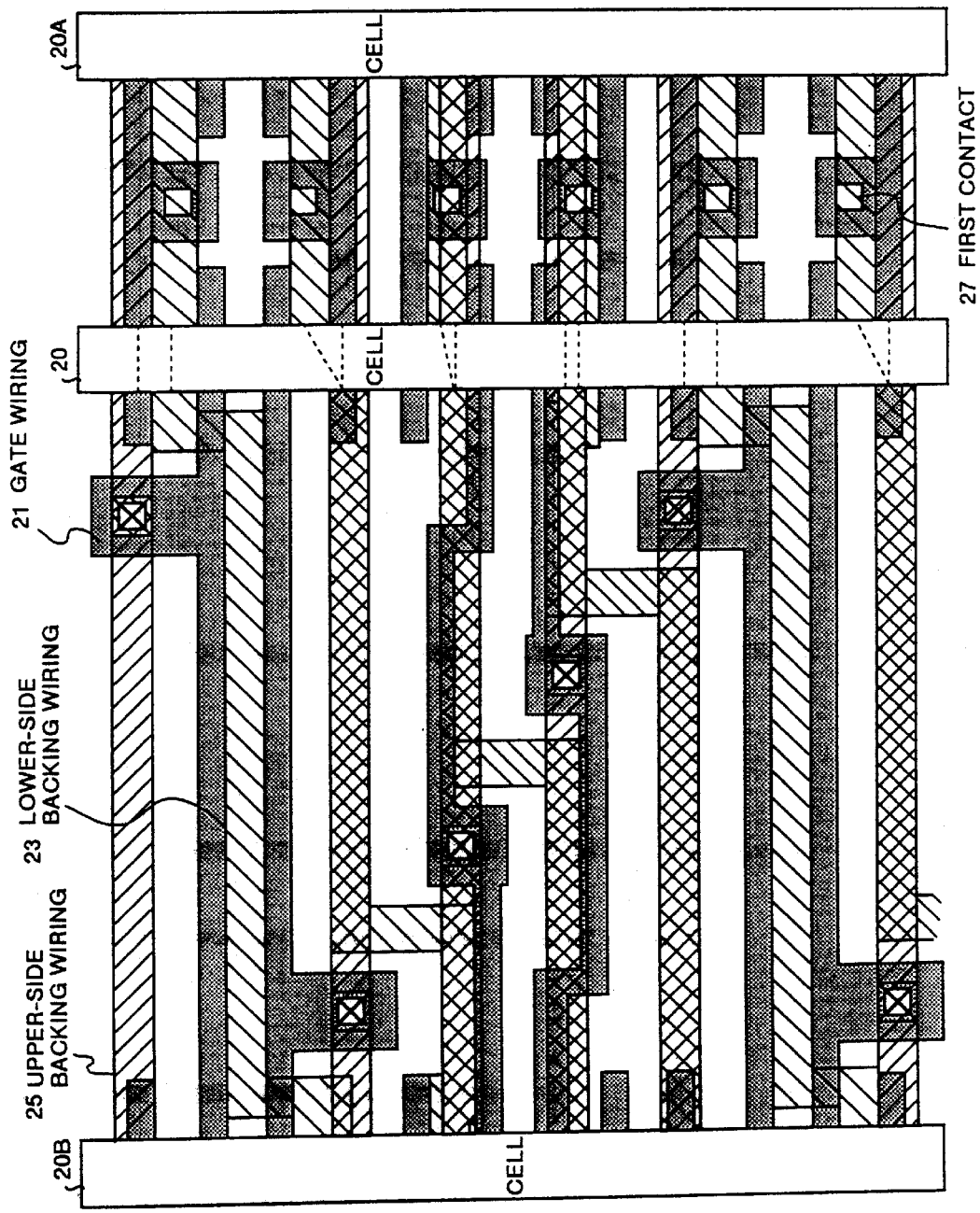
FIG. 13 is a layout showing a wiring pattern between memory cells of the DRAM in the sixth embodiment of the semiconductor integrated circuit device according to the present invention.

FIG. 13 is a layout showing a wiring pattern between memory cells of a DRAM in a sixth embodiment. As shown in FIG. 13, the sixth embodiment is realized by providing the lines of gate wiring 21, in the first embodiment, in a staggered arrangement for every two lines, also distributing second contacts 28 on four columns between the memory cell 20 and memory cell 20B, and arranging the contacts on columns by successively shifting from a column to the next. The other elements of the configuration are the same as those in the first embodiment, therefore the same reference numerals are assigned to the elements corresponding to those in the first embodiment and description thereof is omitted herein.

According to the sixth embodiment, the upper-side backing wiring 25 and the lower-side backing wiring 23 can be provided with a pitch around eight by five (8/5) times wider as compared to the pitch of the gate wiring 21. Therefore, the gate wiring 21 can be provided with a pitch smaller than each wiring pitch of the upper-side backing wiring 25 and lower-side backing wiring 23, thus a higher degree of integration in the DRAM or reduction of a chip size can be achieved in the same manner as in the first embodiment.

Figure 14:
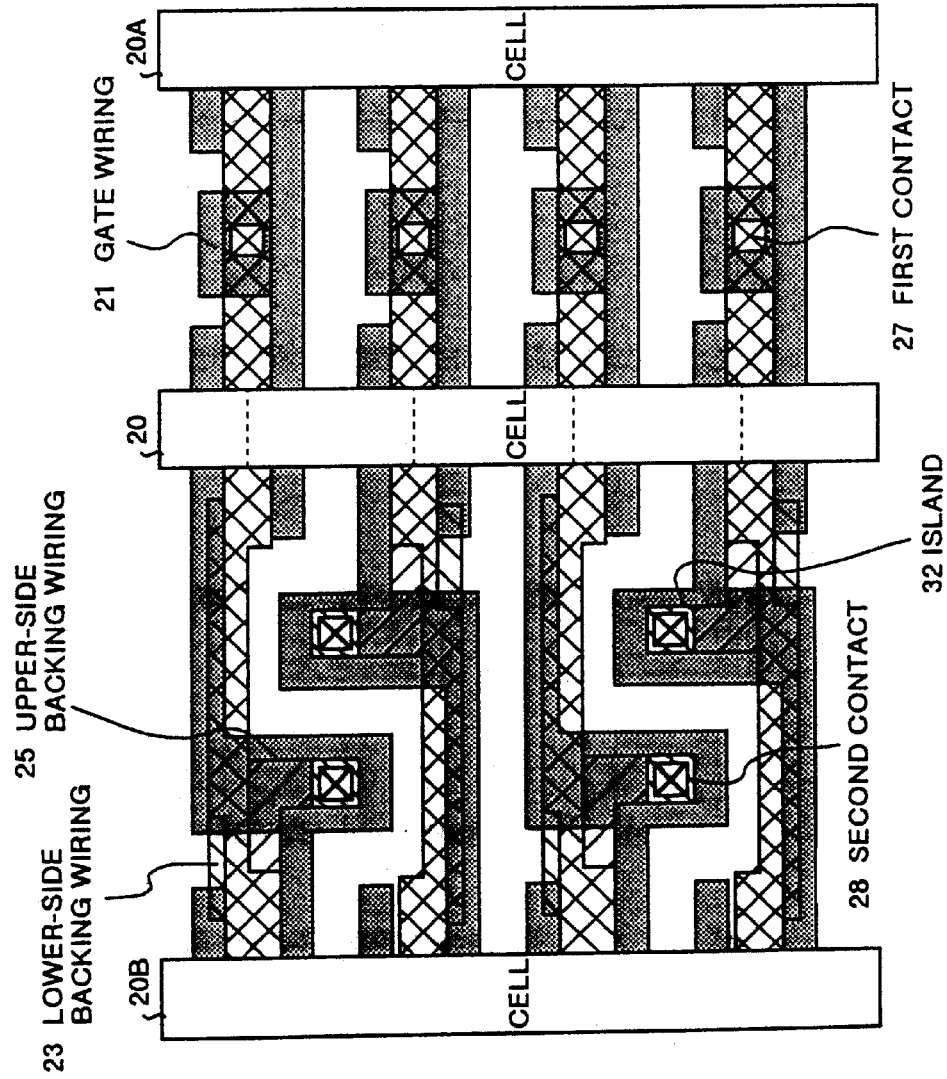
FIG. 14 is a layout showing a wiring pattern between memory cells of the DRAM in the seventh embodiment of the semiconductor integrated circuit device according to the present invention.
Figure 15:
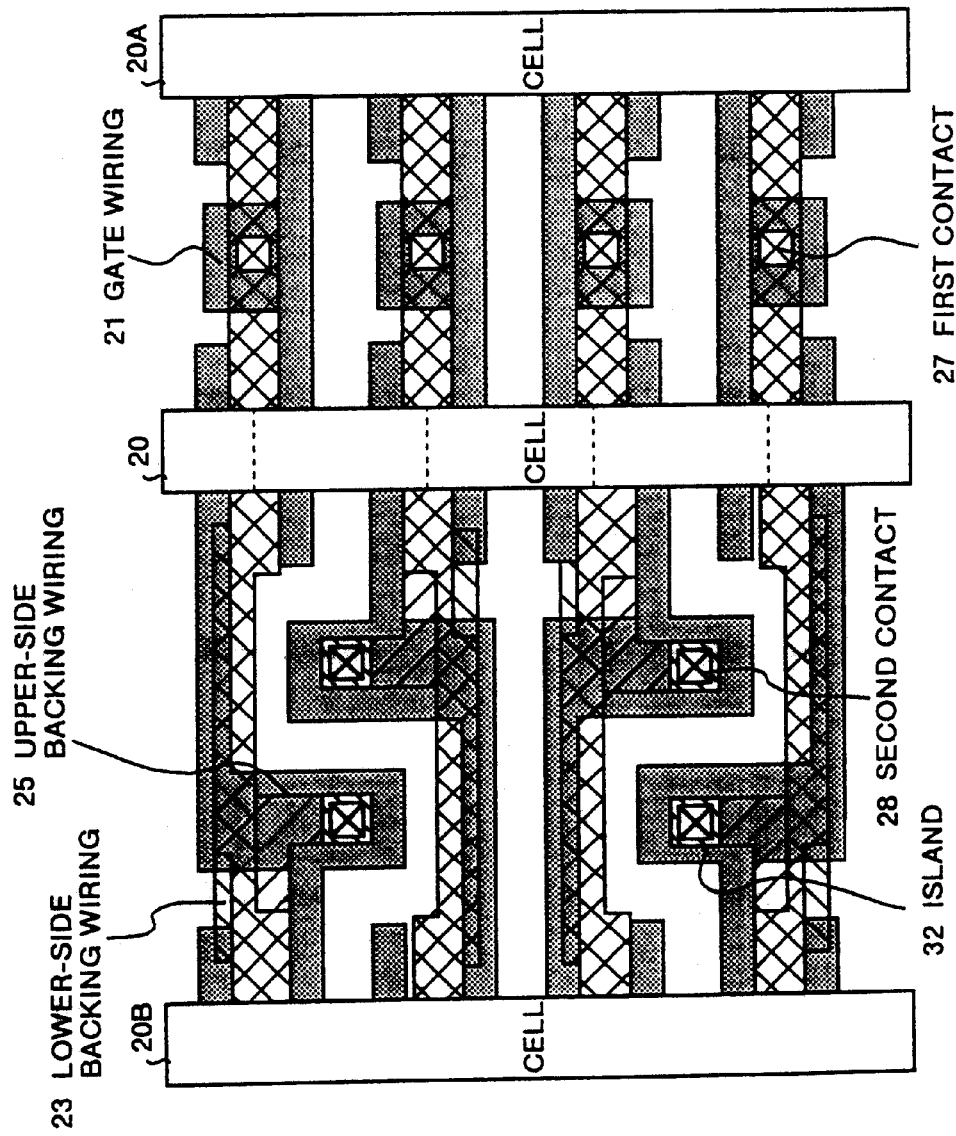
FIG. 15 is a layout showing a wiring pattern between memory cells of the DRAM in the seventh embodiment of the semiconductor integrated circuit device according to the present invention.

FIG. 14 and FIG. 15 are layouts each showing a wiring pattern between memory cells of a DRAM in a seventh embodiment. As shown in FIG. 14, the seventh embodiment is different from the first embodiment in that a pair of lines of lower-side backing wiring 23 are provided so as to sandwich a pair of second contacts 28 therebetween in place of the lower-side backing wiring 23 passing through between the second contacts 28 which are distributed and arranged on two columns between the memory cell 20 and memory cell 20B. The other elements of the configuration are the same as those in the first embodiment, therefore the same reference numerals are assigned to the elements corresponding to those in the first embodiment and description thereof is omitted herein.

Of the second contacts 28 adjacent to each other, second contacts 28 not in a pair may be arranged on two different lines extending in the vertical direction with respect to the direction to which the gate wiring 21 extends (lateral direction in the figure) as shown in FIG. 14, and also may not be arranged on two different lines as shown in FIG. 15.

According to the seventh embodiment, the upper-side backing wiring 25 and the lower-side backing wiring 23 can be provided with a pitch around four by three (4/3) times wider as compared to the pitch of the gate wiring 21. Therefore, in addition to such an effect that a higher degree of integration in the DRAM or reduction of a chip size can be achieved like in the first embodiment, there is another effect that the width of the second contacts 28 can be made smaller as compared to that in the first embodiment because the lower-side backing wiring 23 is not provided between the second contacts 28.

Figure 16:
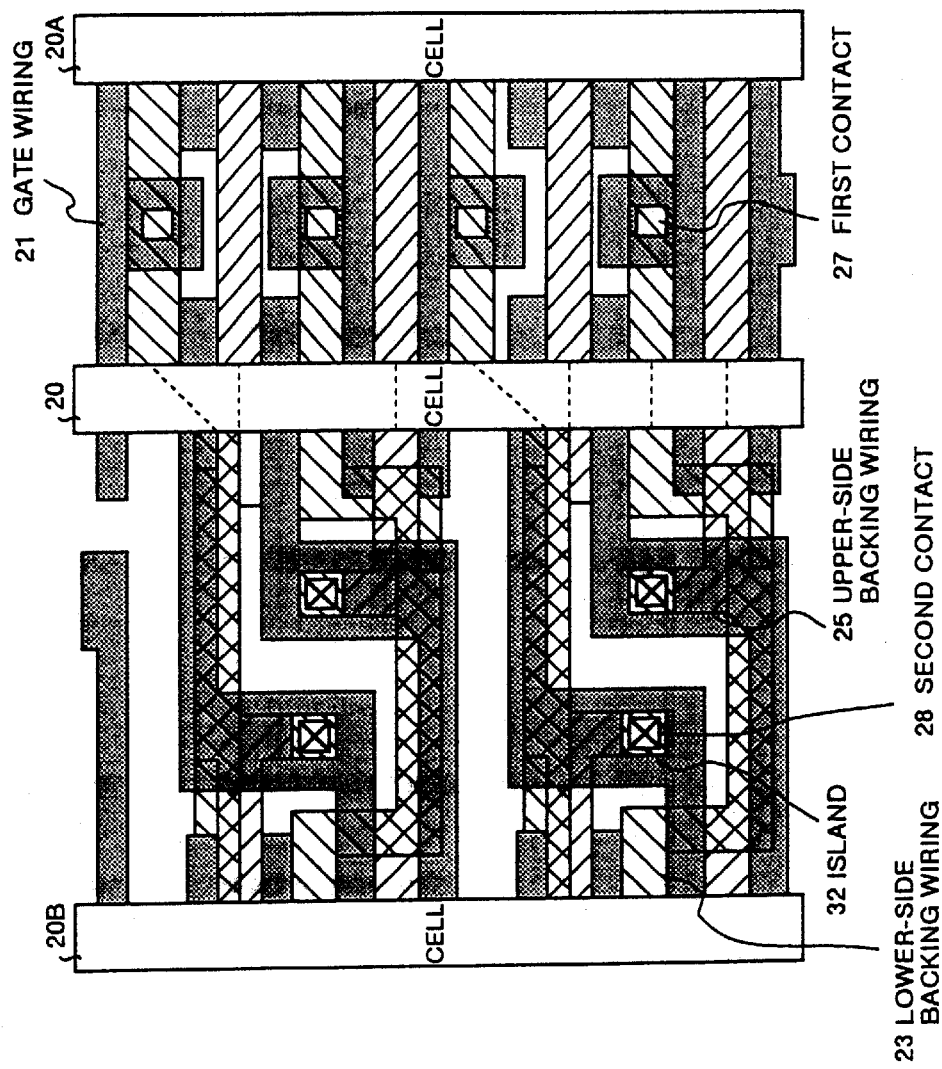
FIG. 16 is a layout showing a wiring pattern between memory cells of the DRAM in the eighth embodiment of the semiconductor integrated circuit device according to the present invention.

FIG. 16 is a layout showing a wiring pattern between memory cells of a DRAM in an eighth embodiment. As shown in FIG. 16, the eighth embodiment is different from the first embodiment in that a pair of lines of lower-side backing wiring 23 are provided so as to sandwich a pair of second contacts 28 therebetween like in the seventh embodiment. In addition, the lines of gate wiring 21 are provided in a staggered arrangement for every two lines. The other elements of the configuration are the same as those in the first embodiment, therefore the same reference numerals are assigned to the elements corresponding to those in the first embodiment and description thereof is omitted herein.

According to the eighth embodiment, the upper-side backing wiring 25 and the lower-side backing wiring 23 can be provided with a pitch around four by three (4/3) times wider as compared to the pitch of the gate wiring 21. Therefore, in addition to such the effect that a higher degree of integration in the DRAM or reduction of a chip size can be achieved like in the first embodiment, there is another effect that the width of the second contacts 28 can be made smaller as compared to that in the first embodiment because the lower-side backing wiring 23 is not provided between the second contacts 28.

The present invention as described above is applicable to backing wiring for a bit line of a DRAM and also applicable to backing wiring for a signal line of any semiconductor integrated circuit device other than the DRAM. In the third to eighth Embodiments, the gate wiring 21 and the upper-side backing wiring 25 may electrically be connected to each other directly by the second contacts 28 in the same manner as in the second embodiment.

As described above, with the present invention, even when a line width of a signal line in a contact for electrically connecting a signal line to an upper-side auxiliary wired layer is widened, a pitch of a lower-side auxiliary signal line does not need to be widened. Therefore, each wiring pitch of the upper and lower auxiliary signal lines can be made narrower. This allows a higher degree of integration of a semiconductor integrated circuit device or reduction of a chip size to be achieved.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor integrated circuit device comprising:
   a signal line;
   a first auxiliary signal line formed on a wired layer provided on a layer upper than said signal line via an insulation layer;
   a second auxiliary signal line formed on a wired layer provided on a layer upper than said first auxiliary signal line via an insulation layer;
   first contacts for electrically connecting said signal line to said first auxiliary signal line; and
   second contacts for electrically connecting said signal line to said second auxiliary signal line; wherein
   said second contacts are distributed and arranged on two or more different lines extending in a vertical direction with respect to a substantial direction to which said signal line extends, and a pair of said second contacts adjacent to each other are arranged on different lines, and
   said first auxiliary signal line is formed into a bent pattern so as to pass through between said pair of second contacts adjacent to each other.

2. The semiconductor integrated circuit device according to claim 1; wherein each of said second contacts comprises a conductive island formed on the same wired layer as that of said first auxiliary signal line; a first auxiliary contact for electrically connecting said signal line to said island; and a second auxiliary contact for electrically connecting said island to said second auxiliary signal line, and said first auxiliary contact and said second auxiliary contact are arranged on the same line.

3. The semiconductor integrated circuit device according to claim 1; wherein each of said second contacts comprises a conductive island formed on the same wired layer as that of said first auxiliary signal line; a first auxiliary contact for electrically connecting said signal line to said island; and a second auxiliary contact for electrically connecting said island to said second auxiliary signal line, and said first auxiliary contact and said second auxiliary contact are arranged by being displaced from each other on two different stages.

4. The semiconductor integrated circuit device according to claim 1; wherein each of said second contacts directly and electrically connects said signal line to said second auxiliary signal line.

5. The semiconductor integrated circuit device according to claim 1; wherein said first contacts and said second contacts are provided alternately for every one unit or every two units for a plurality of signal lines.

6. The semiconductor integrated circuit device according to claim 1; wherein said signal line is a word line or a bit line of a semiconductor storage device.

7. The semiconductor integrated circuit device according to claim 1, wherein said signal line, said first auxiliary signal line, and said second auxiliary signal line are provided in plurality.

8. A semiconductor integrated circuit device comprising:
   a signal line;
   a first auxiliary signal line formed on a wired layer provided on a layer upper than said signal line via an insulation layer;
   a second auxiliary signal line formed on a wired layer provided on a layer upper than said first auxiliary signal line via an insulation layer;
   first contacts for electrically connecting said signal line to said first auxiliary signal line; and
   second contacts for electrically connecting said signal line to said second auxiliary signal line; wherein
   said second contacts are distributed and arranged on two or more different lines extending in a vertical direction with respect to a substantial direction to which said signal line extends, and a pair of said second contacts adjacent to each other are arranged on different lines between a pair of said first auxiliary signal lines adjacent to each other.

9. The semiconductor integrated circuit device according to claim 8; wherein each of said second contacts comprises a conductive island formed on the same wired layer as that of said first auxiliary signal line; a first auxiliary contact for electrically connecting said signal line to said island; and a second auxiliary contact for electrically connecting said island to said second auxiliary signal line, and said first auxiliary contact and said second auxiliary contact are arranged on the same line.

10. The semiconductor integrated circuit device according to claim 8; wherein each of said second contacts comprises a conductive island formed on the same wired layer as that of said first auxiliary signal line; a first auxiliary contact for electrically connecting said signal line to said island; and a second auxiliary contact for electrically connecting said island to said second auxiliary signal line, and said first auxiliary contact and said second auxiliary contact are arranged by being displaced from each other on two different stages.

11. The semiconductor integrated circuit device according to claim 8; wherein each of said second contacts directly and electrically connects said signal line to said second auxiliary signal line.

12. The semiconductor integrated circuit device according to claim 8; wherein said first contacts and said second contacts are provided alternately for every one unit or every two units for a plurality of signal lines.

13. The semiconductor integrated circuit device according to claim 8; wherein said signal line is a word line or a bit line of a semiconductor storage device.

14. The semiconductor integrated circuit device according to claim 7, wherein said signal line, said first auxiliary signal line, and said second auxiliary signal line are provided in plurality.

* * * * *